United States Patent
Kim et al.

(10) Patent No.: US 12,368,119 B2
(45) Date of Patent: Jul. 22, 2025

(54) SEMICONDUCTOR PACKAGE

(71) Applicant: SAMSUNG ELECTRONICS CO., LTD., Suwon-si (KR)

(72) Inventors: Minki Kim, Suwon-si (KR); Seungduk Baek, Hwaseong-si (KR); Won Il Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 505 days.

(21) Appl. No.: 17/944,430

(22) Filed: Sep. 14, 2022

(65) Prior Publication Data
US 2023/0163087 A1  May 25, 2023

(30) Foreign Application Priority Data
Nov. 25, 2021 (KR) .................. 10-2021-0164401

(51) Int. Cl.
*H01L 23/00* (2006.01)
*H01L 25/065* (2023.01)

(52) U.S. Cl.
CPC ............. *H01L 24/05* (2013.01); *H01L 24/08* (2013.01); *H01L 25/0657* (2013.01);
(Continued)

(58) Field of Classification Search
CPC ............ H01L 24/05; H01L 24/08; H01L 2224/05009; H01L 2224/05017; H01L 2224/05025; H01L 2224/05076; H01L 2224/05557; H01L 21/76898; H01L 23/5226; H01L 25/0657; H01L 2224/02331; H01L 2224/05018; H01L 2224/05083; H01L 2224/08145; H01L 2924/1431; H01L 2924/1434
See application file for complete search history.

(56) References Cited

U.S. PATENT DOCUMENTS

| 8,399,987 | B2  | 3/2013 | Kwon et al. |
| 8,963,336 | B2* | 2/2015 | Jung ............... H01L 25/50 257/774 |

(Continued)

FOREIGN PATENT DOCUMENTS

KR  10-2021-0036794   4/2021

*Primary Examiner* — Mamadou L Diallo
(74) *Attorney, Agent, or Firm* — MORGAN, LEWIS & BOCKIUS LLP

(57) ABSTRACT

A semiconductor package includes: a semiconductor substrate; a through electrode that penetrates the semiconductor substrate; a first pad disposed on the through electrode; and a dielectric structure disposed on the semiconductor substrate, wherein a lower portion of the dielectric structure at least partially surrounds the through electrode, wherein an upper portion of the dielectric structure at least partially surrounds the first pad, wherein the dielectric structure includes: a first dielectric pattern; an etch stop pattern disposed on the first dielectric pattern; and a second dielectric pattern spaced apart from the first dielectric pattern by the etch stop pattern, wherein the first pad is in contact with the through electrode, the first dielectric pattern, the etch stop pattern, and second dielectric pattern, and wherein a top surface of the through electrode is at a level higher than a level of a top surface of the first dielectric pattern.

20 Claims, 13 Drawing Sheets

(52) U.S. Cl.
CPC ............... *H01L 2224/02331* (2013.01); *H01L 2224/02381* (2013.01); *H01L 2224/0239* (2013.01); *H01L 2224/05009* (2013.01); *H01L 2224/05011* (2013.01); *H01L 2224/05017* (2013.01); *H01L 2224/05018* (2013.01); *H01L 2224/05025* (2013.01); *H01L 2224/05076* (2013.01); *H01L 2224/05083* (2013.01); *H01L 2224/05166* (2013.01); *H01L 2224/05181* (2013.01); *H01L 2224/05187* (2013.01); *H01L 2224/05541* (2013.01); *H01L 2224/05551* (2013.01); *H01L 2224/05557* (2013.01); *H01L 2224/05558* (2013.01); *H01L 2224/05576* (2013.01); *H01L 2224/05647* (2013.01); *H01L 2224/05687* (2013.01); *H01L 2224/08145* (2013.01); *H01L 2225/06527* (2013.01); *H01L 2225/06544* (2013.01); *H01L 2924/1431* (2013.01); *H01L 2924/1434* (2013.01); *H01L 2924/3512* (2013.01)

(56) References Cited

U.S. PATENT DOCUMENTS

| | | | |
|---|---|---|---|
| 9,257,413 B2 | 2/2016 | Yang et al. | |
| 9,524,921 B2* | 12/2016 | Kim | H01L 23/481 |
| 10,121,731 B2 | 11/2018 | Park et al. | |
| 10,971,470 B2 | 4/2021 | Kim et al. | |
| 11,183,477 B2 | 11/2021 | Liff et al. | |
| 2015/0179545 A1* | 6/2015 | Jeong | H01L 23/481 |
| | | | 257/621 |
| 2019/0287867 A1* | 9/2019 | Ho | H01L 21/565 |
| 2021/0005533 A1* | 1/2021 | Cho | H01L 21/02164 |
| 2021/0134705 A1* | 5/2021 | Ma | H01L 24/06 |
| 2021/0398929 A1* | 12/2021 | Kim | H01L 23/3157 |
| 2022/0139831 A1* | 5/2022 | Kim | H01L 23/5283 |
| | | | 257/314 |
| 2022/0302053 A1* | 9/2022 | Park | H01L 21/486 |
| 2023/0113465 A1* | 4/2023 | Kim | H01L 25/0652 |
| | | | 257/777 |

\* cited by examiner

SEMICONDUCTOR PACKAGE

CROSS-REFERENCE TO RELATED APPLICATION

This U.S. nonprovisional application claims priority under 35 U.S.C. § 119 to Korean Patent Application No. 10-2021-0164401 filed on Nov. 25, 2021 in the Korean Intellectual Property Office, the disclosure of which is incorporated by reference herein in its entirety.

TECHNICAL FIELD

The present inventive concept relates to a semiconductor package.

DISCUSSION OF THE RELATED ART

In response to the rapid development of the electronic industry and user demands, electronic products have become smaller and increasingly multifunctional. There are also increased desires for miniaturization and multi-functionality of semiconductor devices used for electronic products. Therefore, a semiconductor package with stacked semiconductor chips, each which including through vias (TSV), has been under development.

SUMMARY

According to an exemplary embodiment of the present inventive concept, a semiconductor package includes: a semiconductor substrate including a first surface and a second surface that face each other; a through electrode that penetrates the semiconductor substrate; a first pad disposed on the through electrode; and a dielectric structure disposed on the first surface of the semiconductor substrate, wherein a lower portion of the dielectric structure at least partially surrounds the through electrode, wherein an upper portion of the dielectric structure at least partially surrounds the first pad, wherein the dielectric structure includes: a first dielectric pattern disposed in the lower portion; an etch stop pattern disposed on the first dielectric pattern; and a second dielectric pattern disposed in the upper portion and spaced apart from the first dielectric pattern by the etch stop pattern, wherein a bottom surface of the first pad is in contact with the through electrode, the first dielectric pattern, and the etch stop pattern, wherein a lateral surface of the first pad is in contact with the second dielectric pattern, and wherein a top surface of the through electrode is at a level higher than a level of a top surface of the first dielectric pattern.

According to an exemplary embodiment of the present inventive concept, a semiconductor package includes: a lower semiconductor chip; and an upper semiconductor chip disposed on the lower semiconductor chip, wherein the lower semiconductor chip includes: a lower semiconductor substrate having a first surface and a second surface that face each other; a first through electrode that penetrates the lower semiconductor substrate; a first pad disposed on the first through electrode; and an etch stop pattern disposed on the first surface of the lower semiconductor substrate and in contact with an edge on opposite sides of a bottom surface of the first pad, wherein the upper semiconductor chip includes: an upper semiconductor substrate having a third surface and a fourth surface that face each other, wherein the third surface is closer than the fourth surface to the lower semiconductor chip; a second through electrode that penetrates the upper semiconductor substrate; a wiring layer disposed on the third surface of the upper semiconductor substrate and connected to the second through electrode; and a second pad disposed on the wiring layer, wherein the wiring layer includes a first metal wiring pattern and a second metal wiring pattern stacked on the third surface, wherein a thickness of the second metal wiring pattern is greater than a thickness of the first metal pattern, and wherein the first metal wiring pattern and the second metal wiring pattern include different metallic materials from each other.

According to an exemplary embodiment of the present inventive concept, a semiconductor package includes: a first semiconductor chip; and a second semiconductor chip disposed on the first semiconductor chip, wherein the first semiconductor chip includes: a first semiconductor substrate having a first surface and a second surface that face each other; a first through electrode that penetrates the first semiconductor substrate; a first pad disposed on the first through electrode; and an etch stop pattern disposed on the first surface of the first semiconductor substrate and in contact with an edge of a bottom surface of the first pad, wherein the second semiconductor chip includes: a second semiconductor substrate having a third surface and a fourth surface that face each other, wherein the third surface is closer than the fourth surface to the first semiconductor chip; a second through electrode that penetrates the second semiconductor substrate; a wiring layer disposed on the third surface of the second semiconductor substrate and connected to the second through electrode; and a second pad disposed on the wiring layer, wherein the wiring layer includes a first metal wiring line and a second metal wiring line that are stacked on the third surface, wherein the first pad has a first top surface and a first bottom surface that face each other, wherein the second pad has a second top surface and a second bottom surface that face each other, wherein the first top surface of the first pad is in contact with the second bottom surface of the second pad, wherein the first top surface has a first width in a first direction parallel to the first surface, wherein the first bottom surface has a second width in the first direction, wherein the second top surface has a third width in the first direction, wherein the second bottom surface has a fourth width in the first direction, wherein the first width is greater than the second width, wherein the third width is less than the fourth width, wherein the etch stop pattern has a hole that exposes the first through electrode, and wherein a diameter of the first pad is about 1.2 times to about 2 times greater than a diameter of the hole.

DETAIL DESCRIPTION OF THE EMBODIMENTS

Exemplary embodiments of the present inventive concept will now be described more fully with reference to the accompanying drawings.

FIGS. 1 to 9 illustrate cross-sectional views showing a method of fabricating a semiconductor package according to an exemplary embodiment of the present inventive concept.

Figure 1:
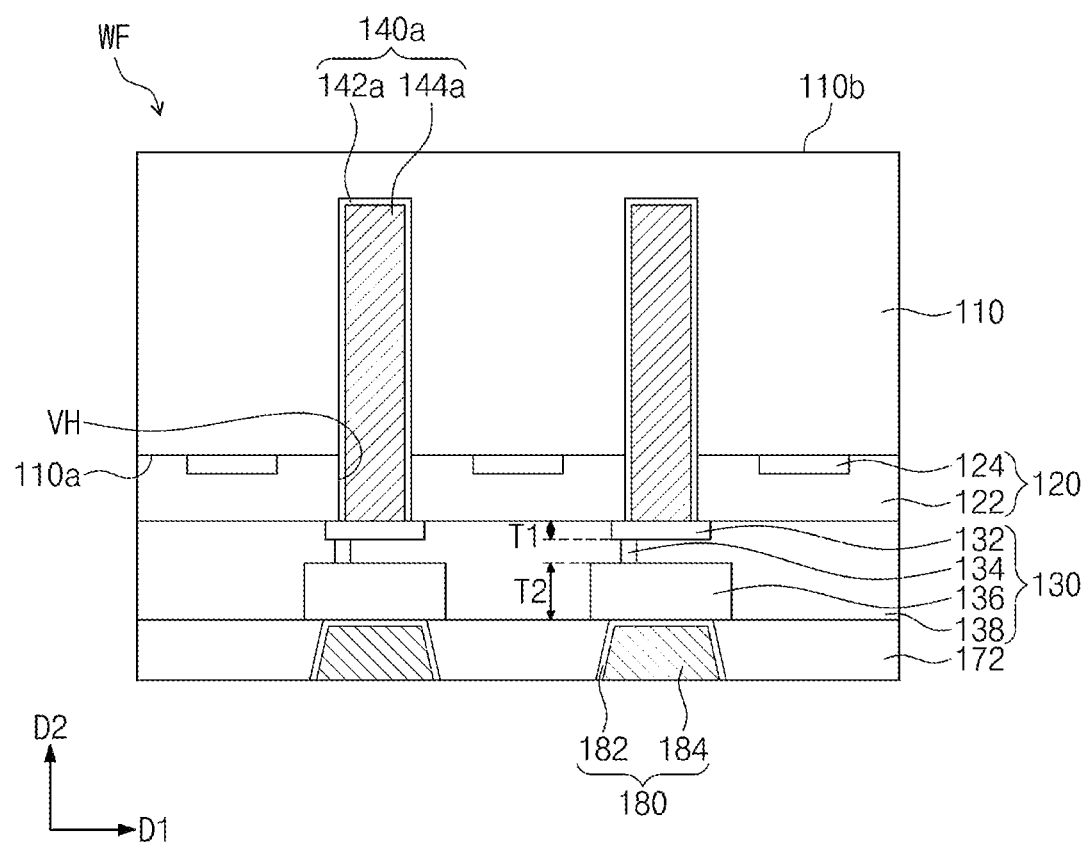
FIGS. 1, 2, 3, 4, 5, 6, 7, 8 and 9 illustrate cross-sectional views showing a method of fabricating a semiconductor package according to an exemplary embodiment of the present inventive concept.

Referring to FIG. 1, a wafer WF may be provided. The wafer WF may include a first semiconductor substrate 110, a first circuit layer 120, a first wiring layer 130, a preliminary through electrode 140a, a first protection layer 172, and a first lower pad 180.

The first semiconductor substrate 110 may include, for example, one of Si, SiC, SiGe, SiGeC, Ge alloys, GaAs, and/or InAs.

The first semiconductor substrate 110 may have a first surface 110a and a second surface 110b that face each other. In this description, a first direction D1 may be parallel to a second surface 110b, and a second direction D2 may be substantially perpendicular to the second surface 110b.

The first surface 110a of the first semiconductor substrate 110 may be an active surface on which the first circuit layer 120 is formed. The first semiconductor substrate 110 may have p-type or n-type impurity doped regions formed on the first surface 110a on which the first circuit layer 120 is formed.

The first circuit layer 120 may include a first interlayer dielectric layer 122 and a first semiconductor element 124. The first interlayer dielectric layer 122 may be formed to cover the first semiconductor element 124 on the first surface 110a of the first semiconductor substrate 110. The first interlayer dielectric layer 122 may physically and/or electrically insulate circuits, which are in the first semiconductor element 124, from each other. The first interlayer dielectric layer 122 may have a stack structure, which includes various layers formed of, for example, oxide, nitride, low-k dielectric, high-k dielectric, or any combination thereof that are stacked on each other.

The first semiconductor element 124 may be formed in the first interlayer dielectric layer 122 on the first surface 110a of the first semiconductor substrate 110, and may include a plurality of circuit elements. Based on a type of semiconductor device, the first semiconductor element 124 may include one or more of active elements such transistors and diodes, passive elements such as capacitors and resistors, and any other circuit elements. Depending on a configuration of the first semiconductor element 124, a semiconductor package may include at least one of a system LSI (large scale integration), a logic circuit, an image sensor such as CMOS image sensor (CIS), a microelectromechanical system (MEMS) device, and a memory device such as Flash memory, dynamic random access memory (DRAM), static random access random memory (SRAM) electrically erasable programmable read-only memory (EEPROM), phrase change random access memory (PRAM), magnetic random access memory (MRAM), resistive random access memory (ReRAM), high bandwidth memory (HBM), and hybrid memory cubic (HMC).

The preliminary through electrode 140a may be connected to the first semiconductor element 124. The preliminary through electrode 140a may extend toward the second surface 110b of the first semiconductor substrate 110. The formation of the preliminary through electrode 140a may include forming a via hole VH, and then forming a first diffusion stop layer 142a and a first conductive layer 144a. For example, the first diffusion stop layer 142a may include copper/titanium (Cu/Ti), and the first conductive layer 144a may include copper.

However, the present inventive concept is not limited thereto. In an exemplary embodiment of the present inventive concept, the preliminary through electrode 140a may extend between adjacent first semiconductor elements 124. For example, the preliminary through electrodes 110a and the first semiconductor elements 124 may be alternately arranged in the first direction D1.

After the preliminary through electrode 140a is formed, the first wiring layer 130 may be formed. The first wiring layer 130 may include a first intermetallic dielectric layer 138, a first wiring pattern 132, a second wiring pattern 136, and a first via 134. The first intermetallic dielectric layer 138 may be formed on the first circuit layer 120 and may cover the first wiring pattern 132 and the second wiring pattern 136. However, the present inventive concept is not limited thereto, and for example, the first intermetallic dielectric layer 138 may include a plurality of layers.

The first wiring pattern 132 and the second wiring pattern 136 may be sequentially stacked on each other below the first surface 110a of the first semiconductor substrate 110. The first wiring pattern 132 and the second wiring pattern 136 may be connected to each other through the first via 134 interposed therebetween. The second wiring pattern 136 may correspond to a wiring pattern that is disposed most adjacent to and is in contact with the first lower pad 180.

The first wiring pattern 132 may have a first thickness T1, and the second wiring pattern 136 may have a second thickness T2. The second thickness T2 may be greater than the first thickness T1. For example, the first and second wiring patterns 132 and 136 may include different metallic materials from each other. In addition, the first and second wiring patterns 132 and 135 may include conductive materials whose thermal expansion coefficients are different from each other. For example, the first wiring pattern 132 may include copper, and the second wiring pattern 136 may include aluminum.

The first protection layer 172 may be formed on the first wiring layer 130, and the first lower pad 180 may be formed in the first protection layer 172. For example, the first protection layer 172 may include silicon oxide. The first lower pad 180 may include a second diffusion stop pattern 182 and a second conductive pattern 184. For example, the second diffusion stop pattern 182 may include copper/titanium, and the first conductive pattern 184 may include copper.

Figure 2:
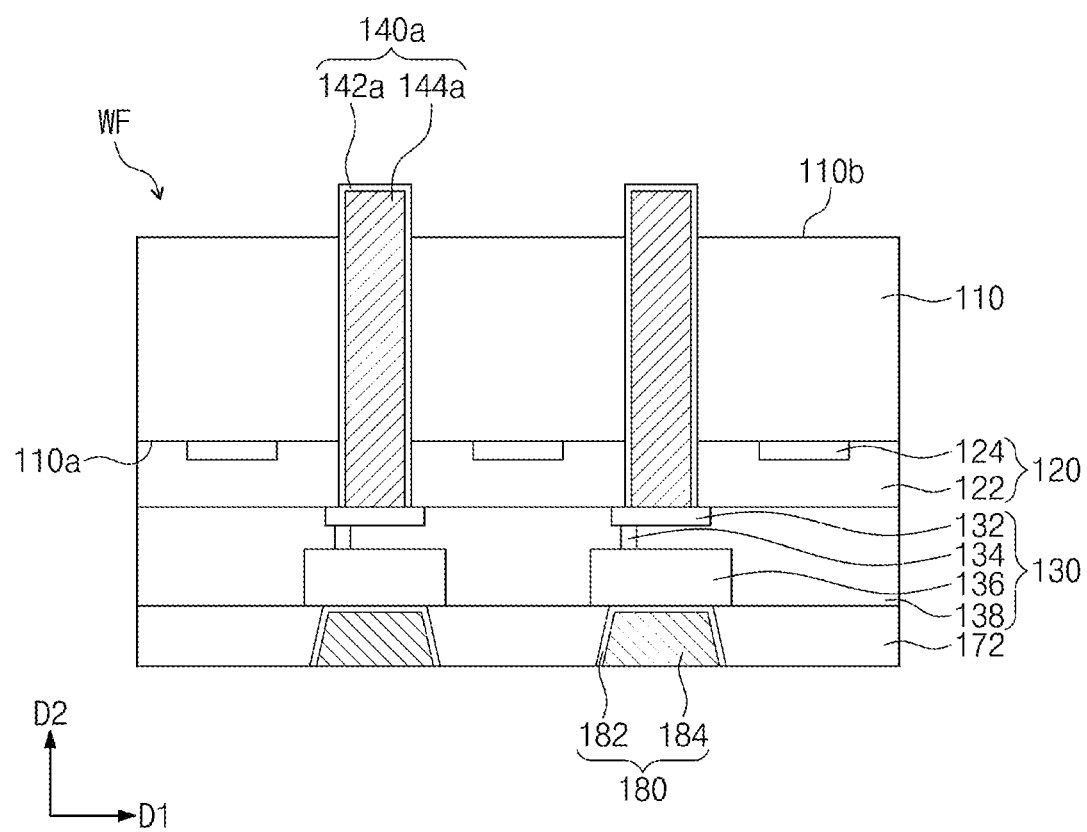

Referring to FIG. 2, a portion of the first semiconductor substrate 110 may be removed to allow the preliminary through electrode 140a to protrude beyond the second surface 110b of the first semiconductor substrate 110. For example, the second surface 110b of the first semiconductor substrate 110 may undergo a grinding process, a chemical mechanical polishing (CMP) process, and/or an etch-back process, such that the preliminary through electrode 140a may protrude beyond the second surface 110b of the first semiconductor substrate 110.

Figure 3:
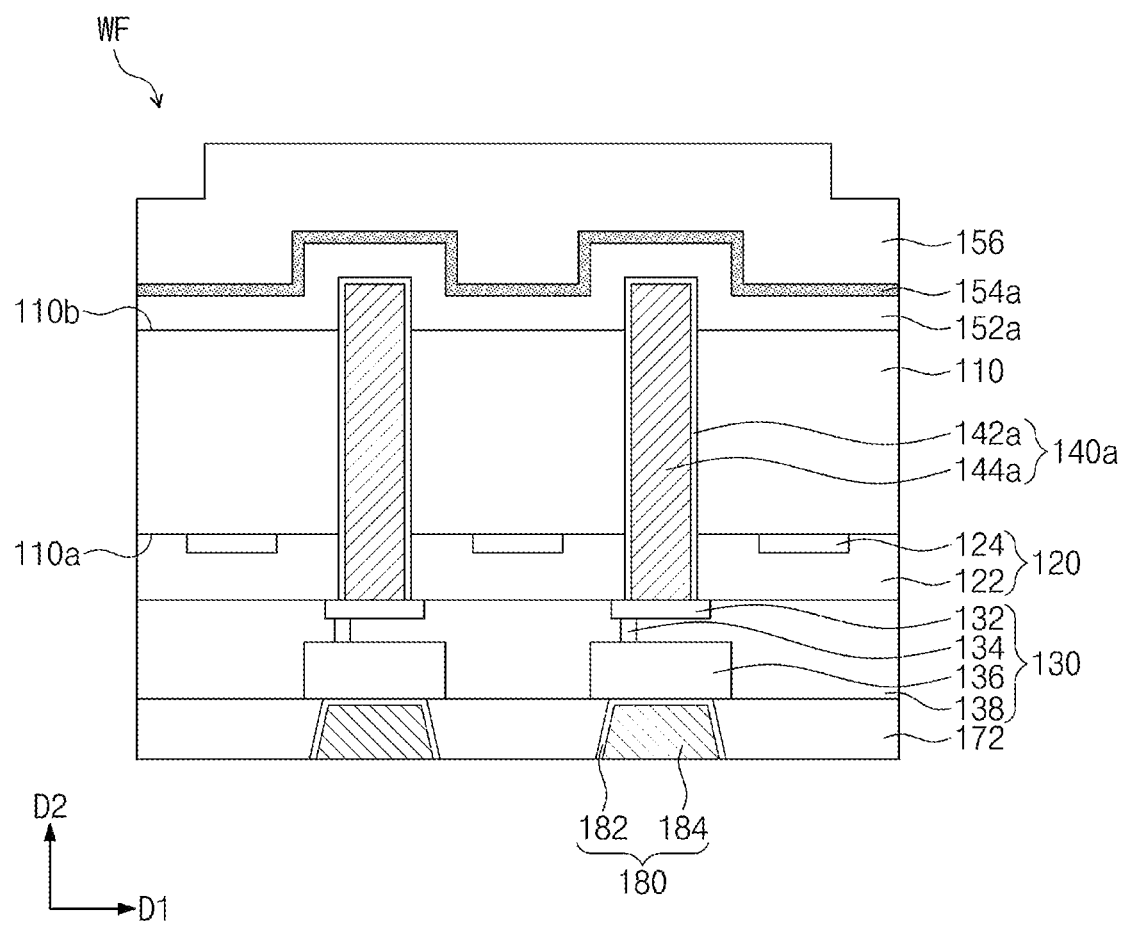

Referring to FIG. 3, a first dielectric layer 152a, a first etch stop layer 154a, and a sacrificial layer 156 may be formed on the second surface 110b of the first semiconductor substrate 110. The formation of each of the first dielectric layer 152a, the first etch stop layer 154a, and the sacrificial layer 156 may be formed by independently performing, for example, chemical vapor deposition (CVD), physical vapor deposition (PVD), or atomic layer deposition (ALD).

Each of the first dielectric layer 152a and the sacrificial layer 156 may include a first dielectric material, and the first etch stop layer 154a may include a second dielectric material. The first and second dielectric materials may be different from each other. For example, the first dielectric material may include silicon oxide, and the second dielectric material may include silicon nitride. The first dielectric layer 152a may have a thickness greater than that of the first etch stop layer 154a.

Figure 4:
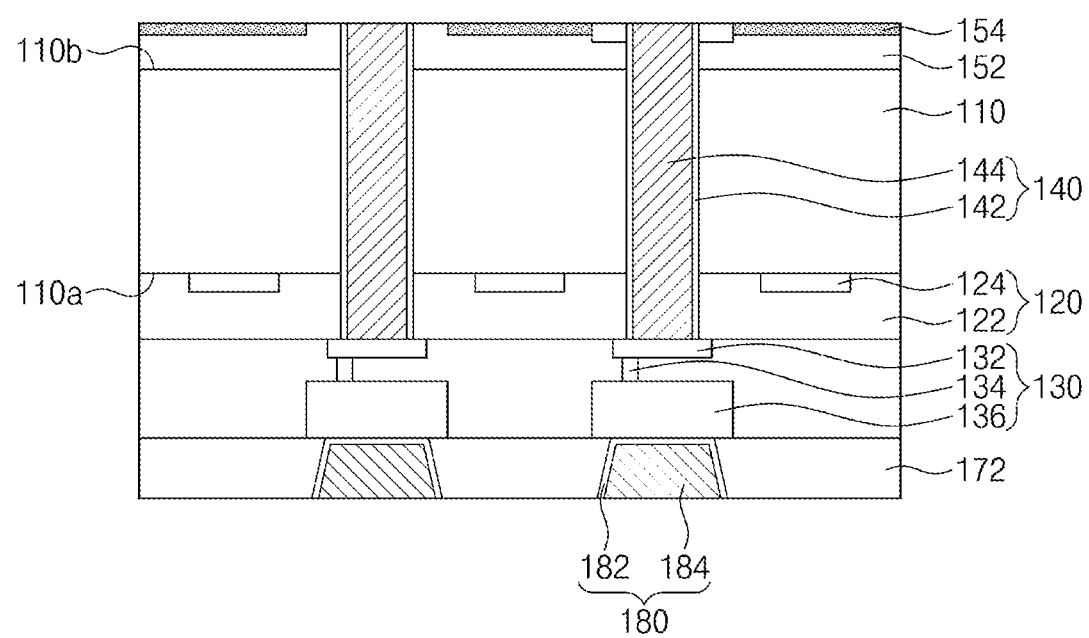

Referring to FIG. 4, the preliminary through electrode 140a may be exposed from the first etch stop layer 154a and the first dielectric layer 152a, which may result in the formation of a first through electrode 140. The exposure procedure may include performing a planarization process (e.g., a chemical mechanical polishing process) in which the first etch stop layer 154a is used as a polishing etch stop layer.

The first through electrode 140 may include a first diffusion stop pattern 142 and a first conductive pattern 144. In the planarization process, an upper portion of the first diffusion stop layer 142a may be removed to form the first diffusion stop pattern 142. According to an exemplary embodiment of the present inventive concept, an upper portion of the first conductive layer 144a may also be partially removed. In addition, the sacrificial layer 156 may be completely removed during the planarization process. Each of the first dielectric layer 152a and the first etch stop layer 154a may be partially removed to form a first dielectric pattern 152 and a first etch stop pattern 154.

Figure 5:
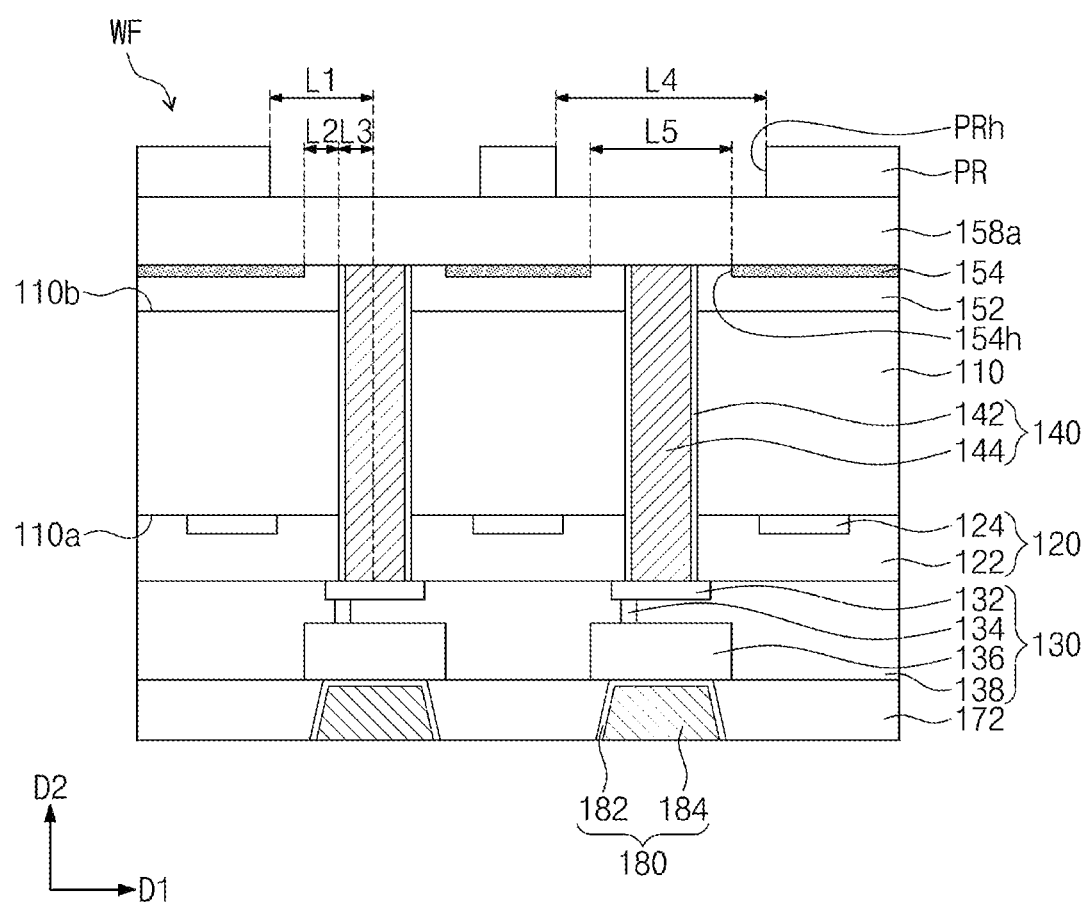

Referring to FIG. 5, a second dielectric layer 158a and a photoresist layer may be sequentially formed on the first through electrode 140, the first dielectric pattern 152, and the first etch stop pattern 154. The second dielectric layer 158a may include a second dielectric material.

The photoresist layer may be patterned to form a photoresist pattern PR. The photoresist pattern PR might not overlap the first through electrode 140, and might not overlap a portion of the first etch stop pattern 154 adjacent to the first through electrode 140. For example, when viewed in the first direction D1, a first length L1 may be provided between the photoresist pattern PR and an extending line extending through a center of the first through electrode 140. In addition, as an example, when viewed in the first direction D1, a second length L2 may be provided between the first etch stop pattern 154 and a lateral surface of the first through electrode 140, and a third length L3 may indicate half of a diameter of the first through electrode 140. The first length L1 may be greater than a sum of the second length L2 and the third length L3 (L1>L2+L3).

The photoresist pattern PR may include a first opening PRh, and the first etch stop pattern 154 may include a second opening 154h that exposes the first through electrode 140. The first and second openings PRh and 154h may vertically overlap each other. A diameter L4 of the first opening PRh may be greater than a diameter L5 of the second opening 154h. For example, the diameter L4 of the first opening PRh may be about 1.2 times to about 2 times greater than the diameter L5 of the second opening 154h.

The photoresist pattern PR may be used as an etching mask to perform an etching process on the second dielectric layer 158a. The etching process may be, for example, a dry etching process (e.g., an ion beam etching process).

Figure 6:
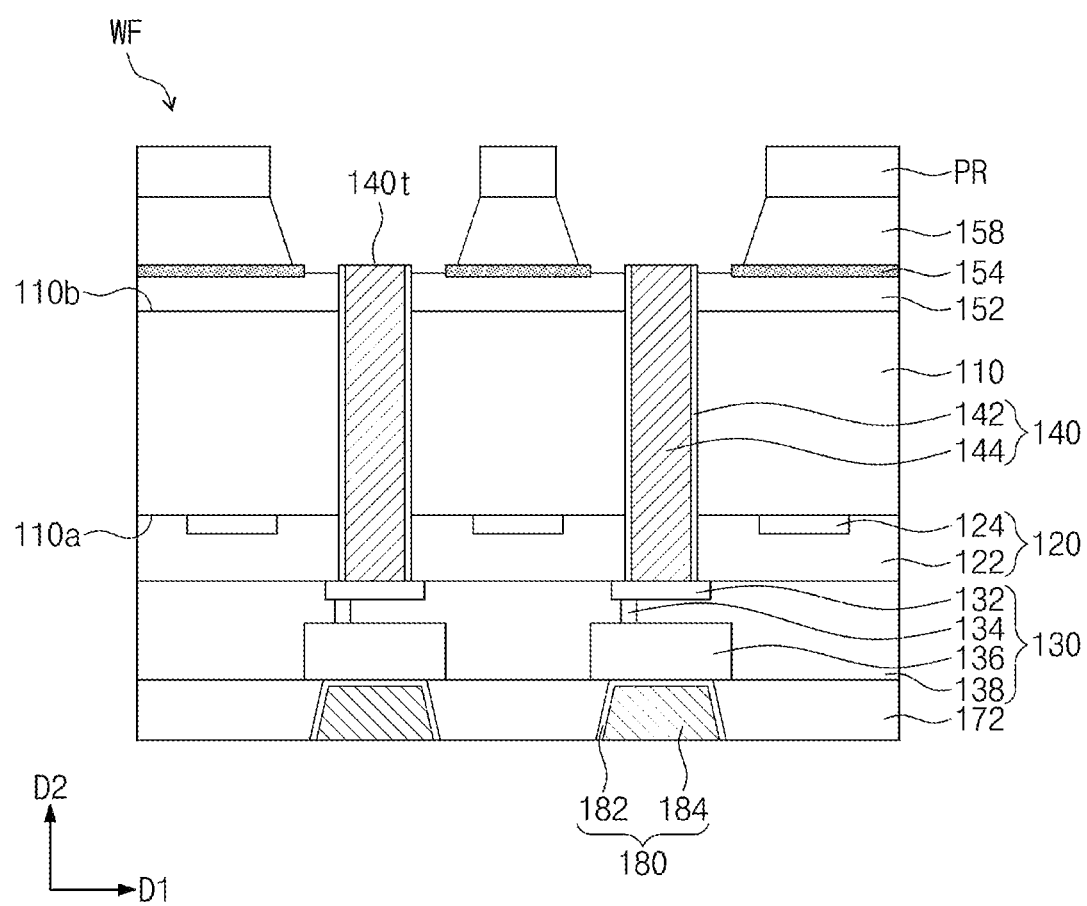
Figure 7:
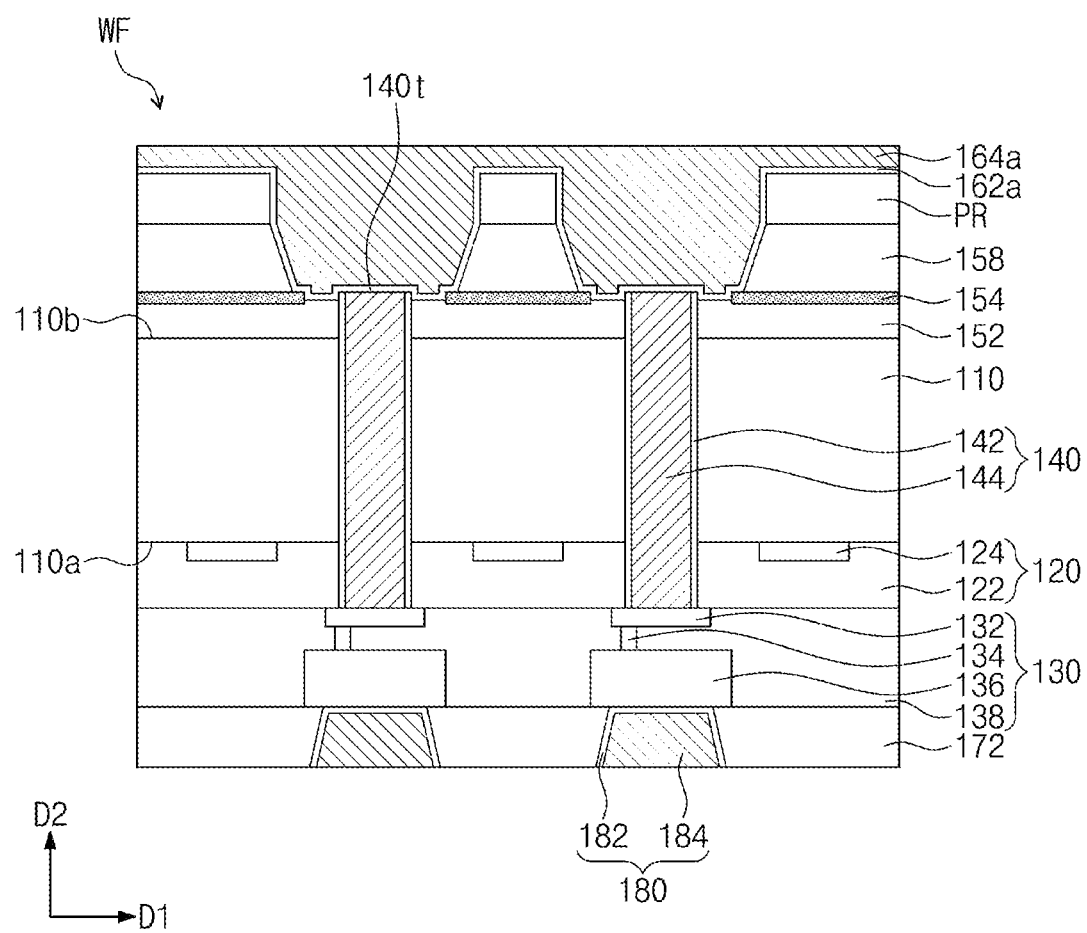

Referring to FIG. 6, the second dielectric layer 158a may be etched to form a second dielectric pattern 158 that exposes the first through electrode 140, a portion of the first dielectric pattern 152, and a portion of the first etch stop pattern 154. The etching process may continue until a top surface 140t of the first through electrode 140 is exposed. The etching process may be a selective etching process. An exposed surface of the first dielectric pattern 152, which includes the same material as that of the second dielectric pattern 158, may be partially etched to allow the first through electrode 140 to protrude from the first dielectric pattern 152. The top surface 140t of the first through electrode 140 may be located at a level higher than that of a top surface of the first dielectric pattern 152. According to an exemplary embodiment of the present inventive concept, the first etch stop pattern 154 exposed from the second dielectric pattern 158 may have a larger etching amount at its portion adjacent to an inner sidewall of an opening in the second dielectric pattern 158 than at its other portions. For example, the first etch stop pattern 154 exposed from the second dielectric pattern 158 may have a larger etching amount at its portion adjacent to a first through electrode 140 than at its other portions Referring to FIG. 7, a second diffusion stop layer 162a and a second conductive layer 164a may be formed to cover top and lateral surfaces of the photoresist pattern PR, a lateral surface of the second dielectric pattern 158, the top surface 140t of the first through electrode 140, and a top surface of the first etch stop pattern 154. The second conductive layer 164a may be formed by an electroplating process in which the second diffusion stop layer 162a is used as a seed layer.

For example, the second diffusion stop layer 162a may include one of Ta/TaN and Ti. The second conductive layer 164a may include copper.

Figure 8:
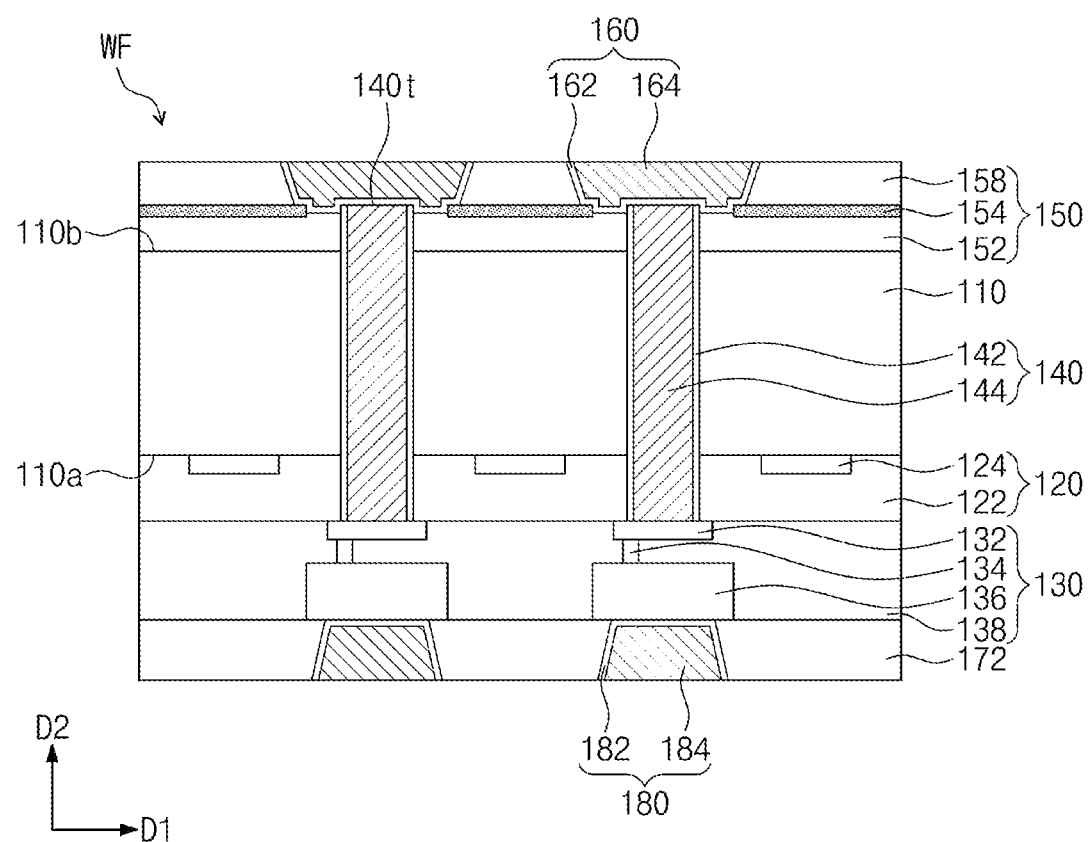

Referring to FIG. 8, the second diffusion stop layer 162a and the second conductive layer 164a may undergo a chemical mechanical polishing process to form a second diffusion stop pattern 162 and a second conductive pattern 164, respectively. The second diffusion stop pattern 162 and the second conductive pattern 164 may constitute a first upper pad 160. For example, the first upper pad 160 may be provided in plural, and may be arranged with a first pitch. For example, the first pitch may be in a range from about 20 μm to about 40 μm. According to an exemplary embodiment of the present inventive concept, the second dielectric pattern 158 may have a thickness that becomes reduced during the chemical mechanical polishing process. According to an exemplary embodiment of the present inventive concept, the second dielectric pattern 158 may have a top surface coplanar with a top surface of the second diffusion stop pattern 162 and a top surface of a second conductive pattern 164. According to an exemplary embodiment of the present inventive concept, the second dielectric pattern 158 may have a top surface coplanar with the top surface 140t of the first through electrode 140.

Figure 9:
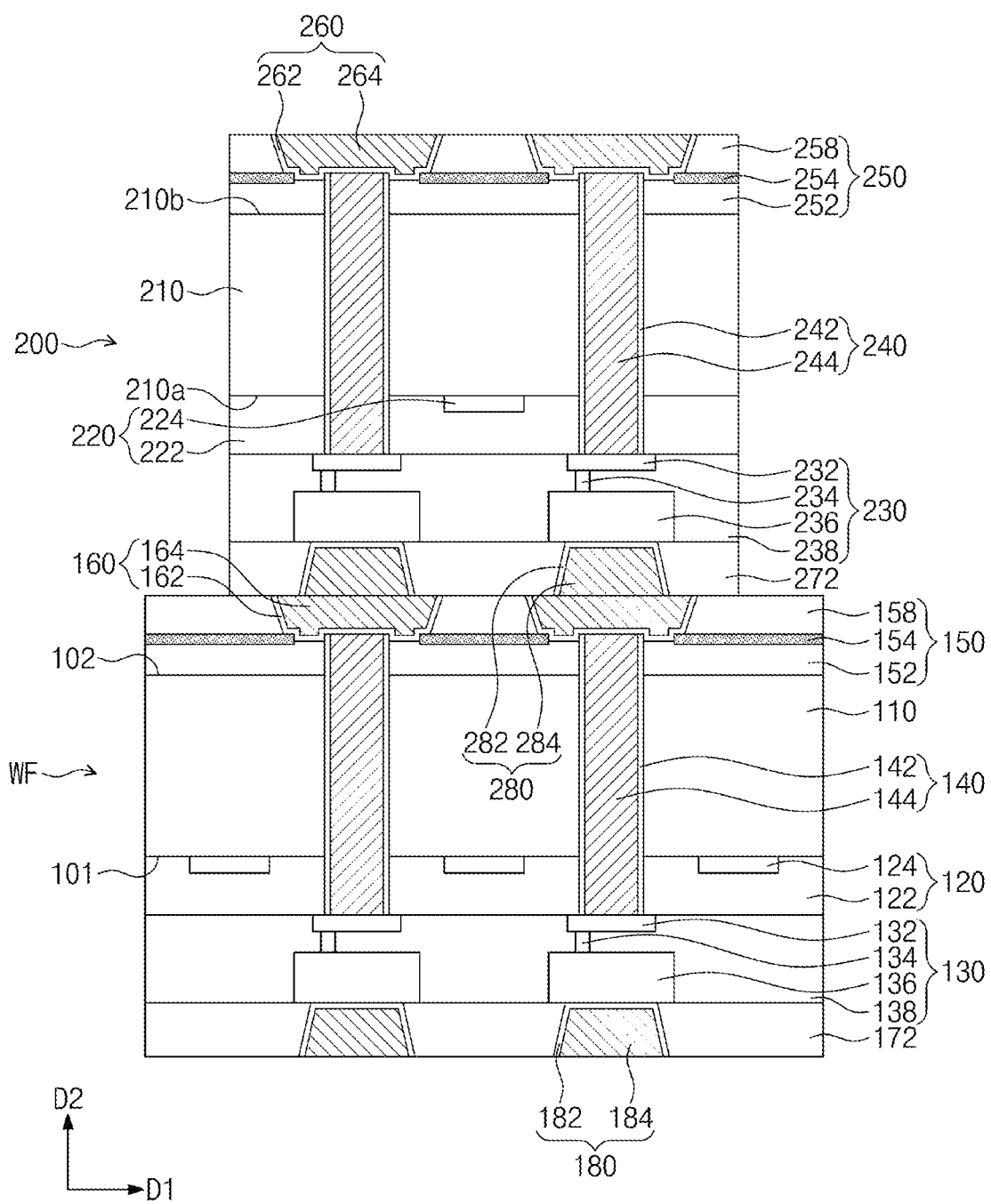

Referring to FIG. 9, a semiconductor chip 200 may be provided on the wafer WF. The semiconductor chip 200 may include a second semiconductor substrate 210, a second circuit layer 220, a second wiring layer 230, a second through electrode 240, a second protection layer 272, a second lower pad 280, a second dielectric structure 250, and a second upper pad 260 that respectively correspond to and are similar to the first semiconductor substrate 110, the first circuit layer 120, the first wiring layer 130, the first through electrode 140, the first protection layer 172, the first lower pad 180, the first dielectric structure 150 and the first rapper pad 160 of the wafer WF. A second semiconductor element 224 may have a circuit element whose function is the same as or different from that of the circuit element included in the first semiconductor element 124.

The second wiring layer 230 may include a second intermetallic dielectric layer 238, a third wiring pattern 232, a fourth wiring pattern 236, and a second via 234, each of which respectively correspond to and may be similar to the first intermetallic dielectric layer 138, the first wiring pattern 132, the second wiring pattern 136, and the first via 134.

The second through electrode 240 may include a third diffusion stop pattern 242 and a third conductive pattern 244, each of which respectively correspond to and may be similar to the first diffusion stop pattern 142 and the first conductive pattern 144.

The second lower pad 280 includes a fourth diffusion stop pattern 282 and a fourth conductive pattern 184, each of which respectively correspond to and may be to similar the second diffusion stop pattern 182 and the second conductive pattern 184.

The semiconductor chip 200 and the wafer WF may be in contact with each other through an oxygen-plasma treatment process, a compression process, and/or an annealing process performed on contact surfaces between the semiconductor chip 200 and the wafer WF.

According to an exemplary embodiment of the present inventive concept, no boundary line may be observed but, for example, a single metal structure may be found between the first upper pad 160 and the second lower pad 280. According to an exemplary embodiment of the present inventive concept, no visible interface may be provided between the second protection layer 272 and the second dielectric pattern 158.

Afterwards, a molding member may be formed to cover the wafer WF and the semiconductor chip 200, and the wafer WF may be diced to form a semiconductor package.

Figure 10:
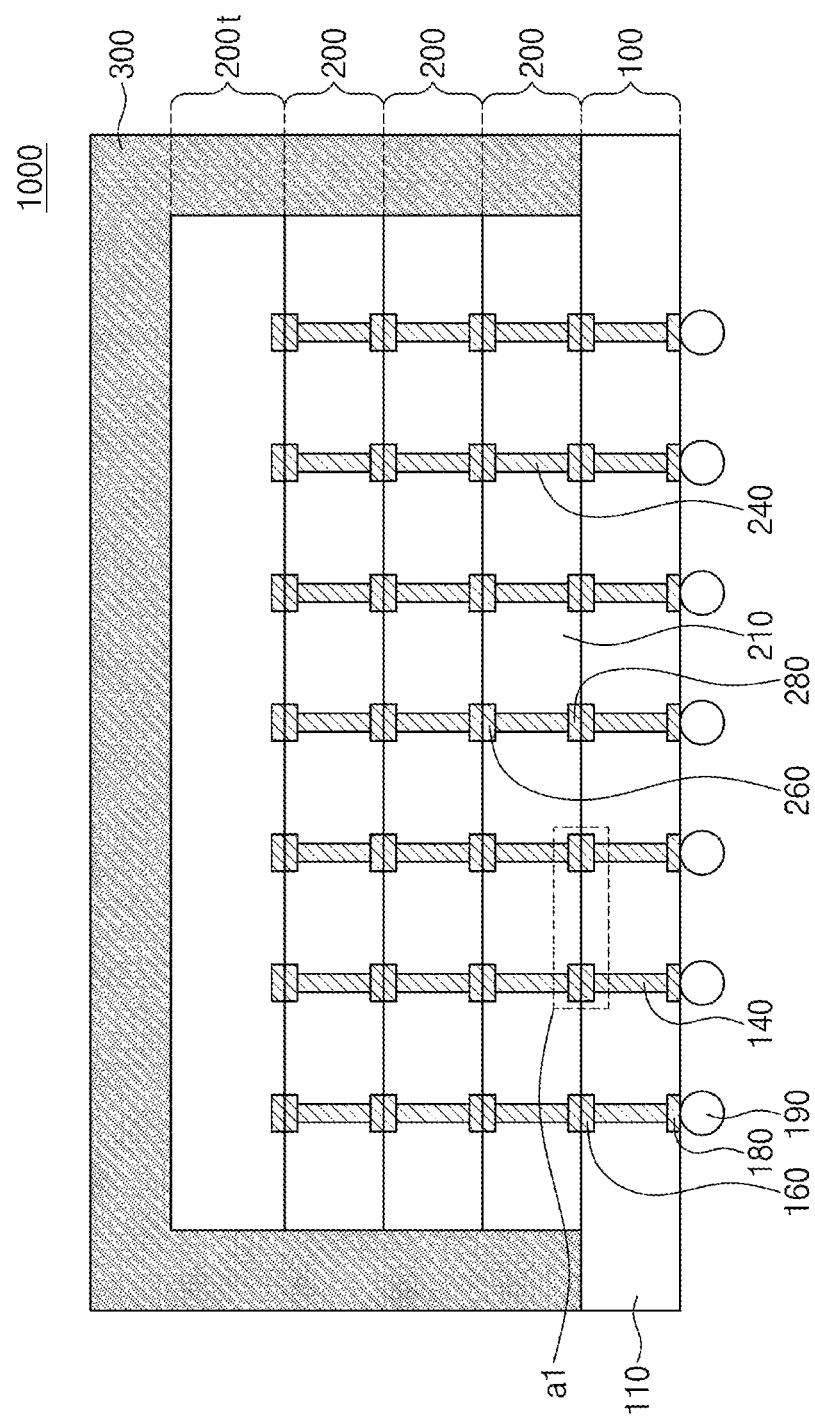
FIG. 10 illustrates a cross-sectional view showing a semiconductor package according to an exemplary embodiment of the present inventive concept.
Figure 11:
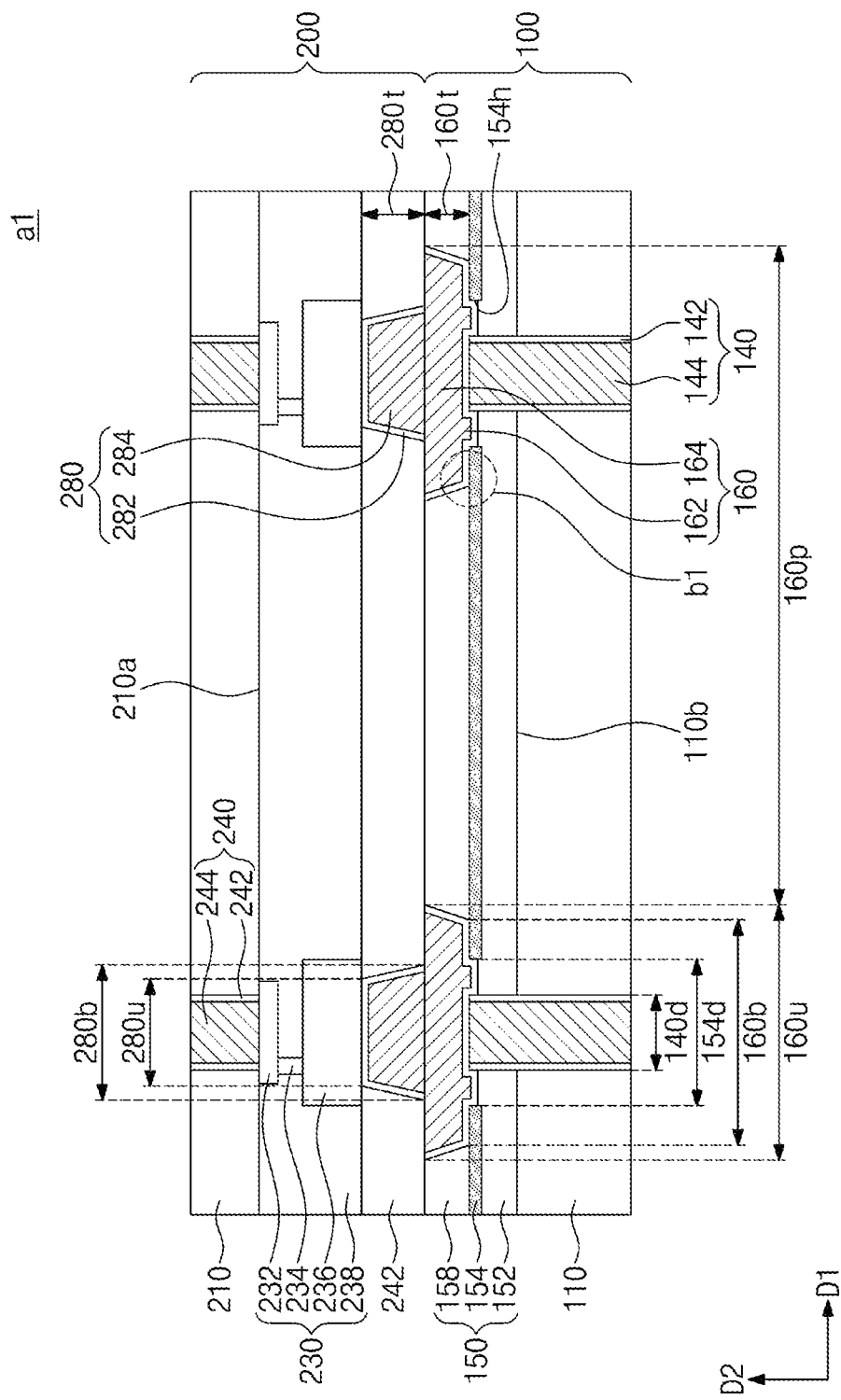
FIG. 11 illustrates an enlarged view showing section a1 of FIG. 10.

FIG. 10 illustrates a cross-sectional view showing a semiconductor package according to an exemplary embodiment of the present inventive concept. FIG. 11 illustrates an enlarged view showing portion a1 of FIG. 10.

Referring to FIG. 10, a semiconductor package 1000 may include a first semiconductor chip 100, a plurality of second semiconductor chips 200 and 200*t*, and a molding structure 300 that covers the first and second semiconductor chips 100, 200, and 200*t*.

The first semiconductor chip 100 may be a single die formed by sawing the wafer WF discussed with reference to FIGS. 1 to 9. For example, the first semiconductor chip 100 may include components substantially the same as those of the wafer WF depicted in FIG. 9. For example, the first semiconductor chip 100 may be a logic chip.

A plurality of connection terminals 190 may be provided on the first lower pads 180 of the first semiconductor chip 100.

The second semiconductor chip 200 may be substantially the same as the semiconductor chip 200 discussed with reference to FIG. 9. The second semiconductor chip 200 may be provided in plural, and the plurality of second semiconductor chips 200 may be stacked on the first semiconductor chip 100. For example, the second semiconductor chip 200 may be a memory chip.

According to an exemplary embodiment of the present inventive concept, an uppermost second semiconductor chip 200*t* might not include the second through electrode 240, the second upper pad 260, and the second dielectric structures 250.

Referring to FIGS. 10 and 11, the first upper pad 160 may have a top surface and a bottom surface that face each other. The first upper pad 160 may have a first upper width 160*u* in a first direction D1 at the top surface thereof, and may also have a first lower width 160*b* in the first direction D1 at the bottom surface thereof. The first upper width 160*u* may be called a diameter of the first upper pad 160. The first upper width 160*u* may be greater than the first lower width 160*b*. In addition, the first upper pad 160 may have an inclined lateral surface. For example, the first upper pad 160 may have a trapezoidal shape whose top-side length is greater than a bottom-side length.

The diameter 160*u* of the first upper pad 160 may range from about 5 μm to about 12 μm. The first upper pad 160 may have a thickness 160*t* of, for example, about 0.5 μm to about 3 μm. An aspect ratio of the thickness 160*t* to the diameter 160*u* of the first upper pad 160 may range from about 0.05 to about 0.6.

The second lower pad 280 may have a top surface and a bottom surface that face each other. The second lower pad 280 may have a second upper width 280*u* in the first direction D1 at the top surface thereof, and may also have a second lower width 280*b* in the first direction D1 at the bottom surface thereof. The second lower width 280*b* may be called a diameter of the second lower pad 280. The second lower width 280*b* may be greater than the second upper width 280*u*. In addition, the second lower pad 280 may have an inclined lateral surface. For example, the second lower pad 280 may have a trapezoidal shape whose bottom-side length is greater than a top-side length.

The second lower pad 280 may be disposed on the first upper pad 160. For example, the top surface of the first upper pad 160 may be in contact with the bottom surface of the second lower pad 280. The first upper width 160*u* of the first upper pad 160 may be greater than the second lower width 280*b* of the second lower pad 280. The thickness 160*t* of the first upper pad 160 may be less than a thickness 280*t* of the second lower pad 280. However, the present inventive concept is not limited thereto, and for example, the thickness 160*t* of the first upper pad 160 may be substantially the same as the thickness 280*t* of the second lower pad 280.

The diameter 160*u* of the first upper pad 160 may be about 1.5 times to about 3 times greater than a diameter 140*d* of the first through electrode 140. For example, the diameter 160*u* of the first upper pad 160 may range from about 5 μm to about 12 μm, and the diameter 140*d* of the first through electrode 140 may range from about 1 μm to about 5 μm. The first lower width 160*b* of the first upper pad 160 may be about 1.2 times to about 2 times greater than a diameter 154*d* of the second opening 154*h* provided in the first etch stop pattern 154.

Figure 12:
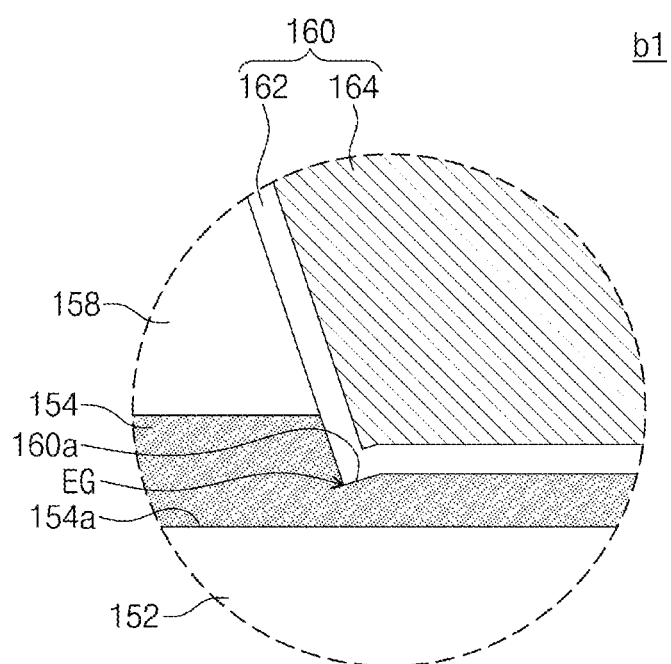
FIG. 12 illustrates an enlarged view showing section b1 of FIG. 11.

FIG. 12 illustrates an enlarged view showing section b1 of FIG. 11.

Referring to FIGS. 11 and 12, at an edge EG of the bottom surface of the first upper pad 160, the first upper pad 160 may have a lowermost surface 160*a* in contact with the first etch stop pattern 154. For example, the lowermost surface 160*a* may be adjacent to the edge EG. As another example, the lowermost surface 160*a* may be connected to the edge EG and a lower surface of the upper pad 160, and the lower surface and the lowermost surface 160*a* may form the bottom surface of the first upper pad 160. For example, the edge EG at the bottom surface of the first upper pad 160 may correspond to a portion where the lateral surface of the first upper pad 160 is joined with an inner sidewall of the second dielectric pattern 158 and with the top surface of the first etch stop pattern 154. For example, the edge EG of the upper pad 160 may be formed in the etch stop pattern 154.

The edge EG of the first upper pad 160 may have a bottom surface located at a level the same as or higher than that of a bottom surface of the first etch stop pattern 154.

The aforementioned description about the relationship between the first upper pad 160 and the first etch stop pattern 154 may be identically applicable to the relationship between the second upper pad 260 and the second etch stop pattern 254.

Figure 13:
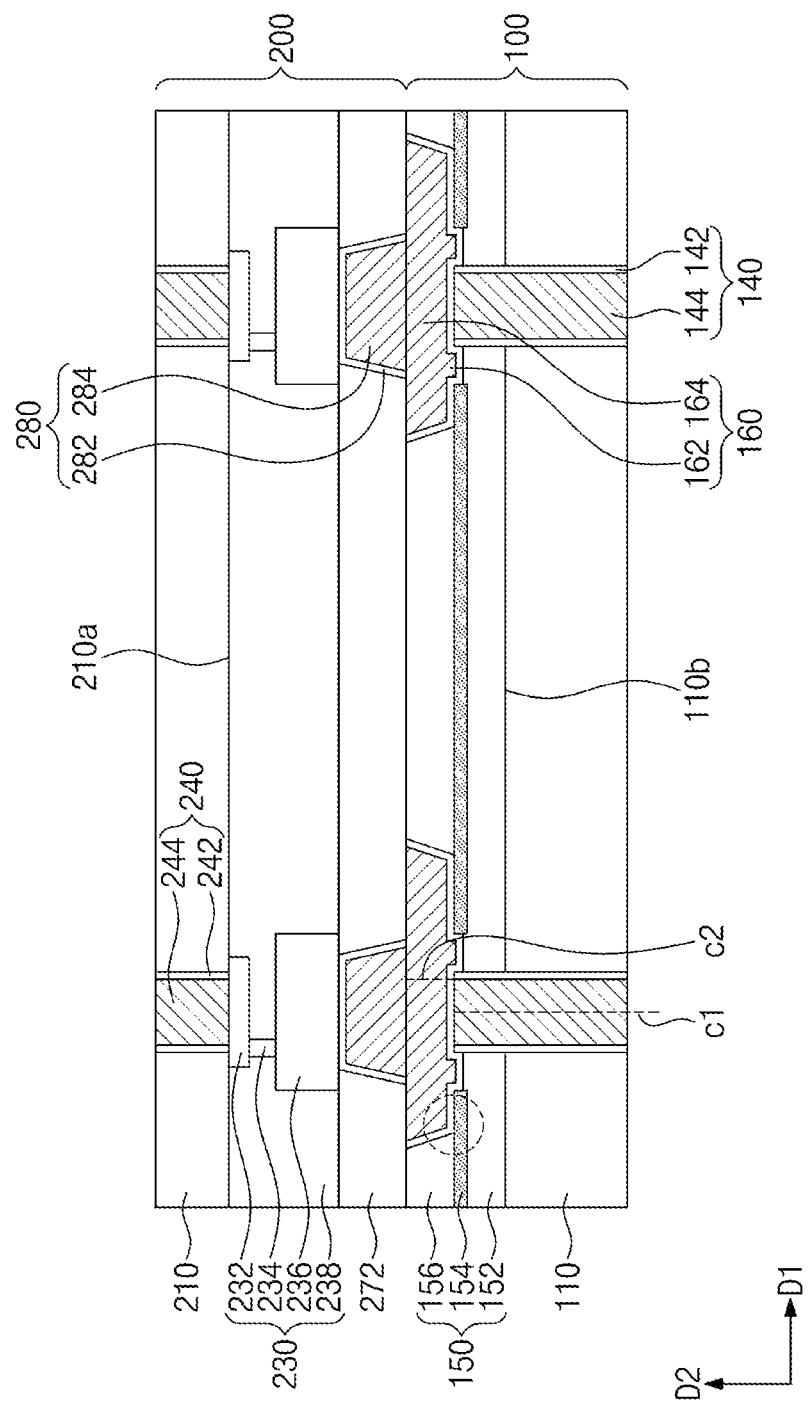
FIG. 13 illustrates an enlarged view showing section a1 of FIG. 10.

FIG. 13 illustrates an enlarged view showing section a1 of FIG. 10.

When misalignment occurs in forming the photoresist pattern PR as shown in FIG. 5, the first opening PRh might not be formed at a desired position. For example, the first opening PRh of the photoresist pattern PR might not expose the first etch stop pattern 154. In this case, during the etching process of FIG. 6, the first dielectric pattern 152 exposed from the second dielectric pattern 158 may have a larger etching amount at its portion adjacent to an inner sidewall of an opening in the second dielectric pattern 158 than at its other portions. As a result, the first dielectric pattern 152 may have therein a micro-trench that is formed to be elongated and pointed toward the first semiconductor substrate 110. When the first upper pad 160 is formed in the state discussed above, the first upper pad 160 may have at its bottom surface an elongated and pointed edge, and the edge may become a point from which crack propagation may occur.

According to an exemplary embodiment of the present inventive concept, the first opening PRh may be formed to have a diameter that determines a diameter of the first upper pad 160, and the diameter of the first opening PRh may be about 1.2 times to about 2 times greater than a diameter of the second opening 154h in the first etch stop pattern 154. Accordingly, the first etch stop pattern 154 may be exposed even when misalignment occurs in forming the first opening PRh. As a result, after the formation of the first upper pad 160, the bottom surface of the first upper pad 160 may be in contact with the first etch stop pattern 154.

Therefore, as shown in FIG. 13, even when a central line c1 of the first through electrode 140 is not coincident with a central line c2 of the first upper pad 160, and even when the first upper pad 160 is formed on one side, the edge of the first upper pad 160 may be in contact with the first etch stop pattern 154. Accordingly, the semiconductor package 1000 may increase in reliability.

A semiconductor package according to an exemplary embodiment of the present inventive concept may be configured such that an etch stop pattern may have an opening that exposes a through electrode (TSV), and that the opening may have a width greater than that of a pad open area for forming an upper pad. Therefore, when the upper pad is formed, an edge of the upper pad may be provided on the etch stop pattern, and thus the semiconductor package may increase in reliability.

While the present inventive concept has been particularly shown and described with reference to example embodiments thereof, it will be apparent to those of ordinary skill in the art that various changes in form and detail may be made thereto without departing from the spirit aid scope of the present inventive concept.

What is claimed is:

1. A semiconductor package, comprising:
   a semiconductor substrate including a first surface and a second surface that face each other;
   a through electrode that penetrates the semiconductor substrate;
   a first pad disposed on the through electrode; and
   a dielectric structure disposed on the first surface of the semiconductor substrate,
   wherein a lower portion of the dielectric structure at least partially surrounds the through electrode,
   wherein an upper portion of the dielectric structure at least partially surrounds the first pad,
   wherein the dielectric structure includes:
      a first dielectric pattern disposed in the lower portion;
      an etch stop pattern disposed on the first dielectric pattern; and
      a second dielectric pattern disposed in the upper portion and spaced apart from the first dielectric pattern by the etch stop pattern,
   wherein a bottom surface of the first pad is in contact with the through electrode, the first dielectric pattern, and the etch stop pattern,
   wherein a lateral surface of the first pad is in contact with the second dielectric pattern, and
   wherein a top surface of the through electrode is at a level higher than a level of a top surface of the first dielectric pattern.

2. The semiconductor package of claim 1, wherein
   each of the first dielectric pattern and the second dielectric pattern includes a first dielectric material,
   the etch stop pattern includes a second dielectric material, and
   the first dielectric material and the second dielectric material are different from each other.

3. The semiconductor package of claim 2, wherein
   the first dielectric material includes silicon oxide, and
   the second dielectric material includes silicon nitride.

4. The semiconductor package of claim 1, wherein a portion of the first pad has a lowermost surface at an edge of the bottom surface of the first pad, and the portion of the first pad is in contact with the etch stop pattern.

5. The semiconductor package of claim 1, wherein a diameter of the first pad is about 1.5 times to about 3 times greater than a diameter of the through electrode.

6. The semiconductor package of claim 1, wherein
   the etch stop pattern has a hole that exposes the through electrode, and
   a diameter of the first pad is about 1.2 times to about 2 times greater than a diameter of the hole.

7. The semiconductor package of claim 1, wherein a first central line passes through a center of the first pad, wherein a second central line passes through a center of the through electrode, wherein, of the first central line and the second central line, the second central line is closer in a first direction, which is parallel to the first surface, to the etch stop pattern.

8. The semiconductor package of claim 1, wherein
   the through electrode and the first pad are each provided in plural,
   the plurality of first pads are arranged at a first pitch,
   a diameter of the first pad is in a range of about 5 μm to about 12 μm, and
   the first pitch is in a range of about 20 μm to about 40 μm.

9. The semiconductor package of claim 1, wherein an aspect ratio of a thickness of the first pad to a diameter of the first pad is in a range of about 0.05 to about 0.6.

10. The semiconductor package of claim 1, further comprising:
    a wiring layer disposed on the second surface of the semiconductor substrate; and
    a second pad disposed on the wiring layer,
    wherein the wiring layer includes a first metal wiring pattern and a second metal wiring pattern that are sequentially stacked on the second surface,
    wherein a thickness of the second metal wiring pattern is greater than a thickness of the first metal wiring pattern, and
    wherein the second pad is in contact with the second metal wiring pattern.

11. The semiconductor package of claim 10, wherein the first metal wiring pattern includes copper, and the second metal wiring pattern includes aluminum.

12. The semiconductor package of claim 10, wherein
the first pad has a first diameter,
the second pad has a second diameter less than the first diameter,
the first pad has a first thickness, and
the second pad has a second thickness greater than the first thickness.

13. The semiconductor package of claim 1, wherein the first pad has a top surface and a bottom surface that face each other, wherein
the top surface of the first pad has a first width in a first direction parallel to the first surface,
the bottom surface of the first pad has a second width in the first direction, and
the first width is greater than the second width.

14. A semiconductor package, comprising:
a lower semiconductor chip; and
an upper semiconductor chip disposed on the lower semiconductor chip,
wherein the lower semiconductor chip includes:
  a lower semiconductor substrate having a first surface and a second surface that face each other;
  a first through electrode that penetrates the lower semiconductor substrate;
  a first pad disposed on the first through electrode; and
  an etch stop pattern disposed on the first surface of the lower semiconductor substrate and in contact with an edge on opposite sides of a bottom surface of the first pad,
wherein the upper semiconductor chip includes:
  an upper semiconductor substrate having a third surface and a fourth surface that face each other, wherein the third surface is closer than the fourth surface to the lower semiconductor chip;
  a second through electrode that penetrates the upper semiconductor substrate;
  a wiring layer disposed on the third surface of the upper semiconductor substrate and connected to the second through electrode; and
  a second pad disposed on the wiring layer,
wherein the wiring layer includes a first metal wiring pattern and a second metal wiring pattern stacked on the third surface,
wherein a thickness of the second metal wiring pattern is greater than a thickness of the first metal pattern, and
wherein the first metal wiring pattern and the second metal wiring pattern include different metallic materials from each other.

15. The semiconductor package of claim 14, wherein the etch stop pattern includes silicon nitride (SiN).

16. The semiconductor package of claim 14, wherein the first pad includes:
a diffusion stop pattern and a conductive pattern disposed on the diffusion stop pattern,
wherein the diffusion stop pattern includes one of Ta/TaN or Ti, and
wherein the conductive pattern includes copper.

17. The semiconductor package of claim 14, wherein
the first pad has a first top surface and a first bottom surface that face each other,
the second pad has a second top surface and a second bottom surface that face each other,
the first top surface of the first pad is in contact with the second bottom surface of the second pad,
the first top surface has a first width in a first direction parallel to the first surface,
the first bottom surface has a second width in the first direction,
the second top surface has a third width in the first direction,
the second bottom surface has a fourth width in the first direction,
the first width is greater than the second width, and
the third width is less than the fourth width.

18. The semiconductor package of claim 17, wherein the first width is greater than the fourth width.

19. The semiconductor package of claim 14, wherein the first metal siring pattern includes copper, and
the second metal wiring pattern includes aluminum.

20. A semiconductor package, comprising:
a first semiconductor chip; and
a second semiconductor chip disposed on the first semiconductor chip,
wherein the first semiconductor chip includes:
  a first semiconductor substrate having a first surface and a second surface that face each other;
  a first through electrode that penetrates the first semiconductor substrate;
  a first pad disposed on the first through electrode; and
  an etch stop pattern disposed on the first surface of the first semiconductor substrate and in contact with an edge of a bottom surface of the first pad,
wherein the second semiconductor chip includes:
  a second semiconductor substrate having a third surface and a fourth surface that face each other, wherein the third surface is closer than the fourth surface to the first semiconductor chip;
  a second through electrode that penetrates the second semiconductor substrate;
  a wiring layer disposed on the third surface of the second semiconductor substrate and connected to the second through electrode; and
  a second pad disposed on the wiring layer,
wherein the wiring layer includes a first metal wiring line and a second metal wiring line that are stacked on the third surface,
wherein the first pad has a first top surface and a first bottom surface that face each other,
wherein the second pad has a second top surface and a second bottom surface that face each other,
wherein the first top surface of the first pad is in contact with the second bottom surface of the second pad,
wherein the first top surface has a first width in a first direction parallel to the first surface,
wherein the first bottom surface has a second width in the first direction,
wherein the second top surface has a third width in the first direction,
wherein the second bottom surface has a fourth width in the first direction,
wherein the first width is greater than the second width,
wherein the third width is less than the fourth width,
wherein the etch stop pattern has a hole that exposes the first through electrode, and
wherein a diameter of the first pad is about 1.2 times to about 2 times greater than a diameter of the hole.

* * * * *